(12) United States Patent
Cheng et al.

(10) Patent No.: US 8,445,955 B2
(45) Date of Patent: May 21, 2013

(54) QUASI-VERTICAL STRUCTURE FOR HIGH VOLTAGE MOS DEVICE

(75) Inventors: Chih-Chang Cheng, Hsinchu (TW); Ruey-Hsin Liu, Hsinchu (TW); Chih-Wen Yao, Hsinchu (TW); Hsiao Chin Tuan, Judong County (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 466 days.

(21) Appl. No.: 12/699,397

(22) Filed: Feb. 3, 2010

(65) Prior Publication Data
US 2010/0219463 A1    Sep. 2, 2010

Related U.S. Application Data

(60) Provisional application No. 61/156,279, filed on Feb. 27, 2009.

(51) Int. Cl.
*H01L 29/78* (2006.01)
*H01L 21/336* (2006.01)

(52) U.S. Cl.
USPC ........................................................ 257/329

(58) Field of Classification Search
USPC ............... 257/213–413, 900, 902–903, 901, 257/592, 929, E21.19–E21.21, E21.394–E21.458, E21.615–E21.694, E29.257, 257/E21.41; 438/135, 142, 217, 287–308, 438/222, 226, 241, 269, 363, 384, 388, 413, 438/416, 429, 442, 478, 481, 486, 489, 438/492–509, 607, 903, 969, 268

See application file for complete search history.

(56) References Cited

U.S. PATENT DOCUMENTS

| 2006/0017092 A1* | 1/2006 | Dong et al. .................. 257/314 |
| 2008/0160697 A1* | 7/2008 | Kao ............................... 438/268 |

OTHER PUBLICATIONS

Moens, P., et al., "Self-Heating Driven Vth Shifts in Integrated VDMOS Transistors", Proceedings of the 18th International Symposium on Power Semiconductor Devices & IC's, Jun. 4-8, 2006, Naples, Italy.

* cited by examiner

*Primary Examiner* — Dao H Nguyen
*Assistant Examiner* — Tram H Nguyen
(74) *Attorney, Agent, or Firm* — Lowe Hauptman Ham & Berner, LLP

(57) ABSTRACT

A semiconductor device provides a high breakdown voltage and a low turn-on resistance. The device includes: a substrate; a buried n+ layer disposed in the substrate; an n-epi layer disposed over the buried n+ layer; a p-well disposed in the n-epi layer; a source n+ region disposed in the p-well and connected to a source contact on one side; a first insulation layer disposed on top of the p-well and the n-epi layer; a gate disposed on top of the first insulation layer; and a metal electrode extending from the buried n+ layer to a drain contact, wherein the metal electrode is insulated from the n-epi layer and the p-well using by a second insulation layer.

14 Claims, 6 Drawing Sheets

QUASI-VERTICAL STRUCTURE FOR HIGH VOLTAGE MOS DEVICE

CROSS-REFERENCE TO RELATED APPLICATIONS

The present application claims priority of U.S. Application Ser. No. 61/156,279 filed on Feb. 27, 2009, which is incorporated herein by reference in its entirety.

TECHNICAL FIELD

Embodiments described herein relate generally to integrated circuits, and more particularly to metal-oxide-semiconductor (MOS) devices, and even more particularly to a MOS structure for high voltage operations.

BACKGROUND

Many metal—oxide—semiconductor field-effect transistors (MOSFET) designed for high voltage applications (with high breakdown voltage) have a vertical structure. Using a vertical structure, it is possible for the transistor to sustain both high blocking voltage and high current. The voltage rating of the transistor is a function of the doping and thickness of the n-epitaxial layer ("n-epi layer") in the case of NMOS, while the current rating is a function of the channel width (i.e. the wider the channel, the higher the current). In a planar structure, the current and breakdown voltage ratings are both a function of the channel dimensions (respectively width and length of the channel), resulting in inefficient use of the "silicon estate." With the vertical structure, the component area is roughly proportional to the current it can sustain, and the component thickness (actually the n-epi layer thickness) is proportional to the breakdown voltage. Vertical MOSFETs are usually designed for switching applications. In general, NMOS is used instead of PMOS for many applications due to better performance given the same dimensions (because of higher mobility of electrons than holes).

In a conventional vertical NMOS, an n+ sinker is generally used for a vertical drain current collection. FIG. 1 illustrates a cross-section of a conventional vertical NMOS with a p-substrate. The vertical NMOS has a p-substrate 102, an n+ buried layer (NBL) 104 and an n-sinker 108 for a vertical drain current collection, an n-epi layer 106, p-bodies 110, source n+ regions 112 and p+ regions 114 both connected to the source contact 116, a gate 118, and a drain contact 120. The n-sinker 108 requires a large lateral space 122 for isolation between the source 116 and the drain 120. However, the required space 122 for the isolation will increase the device area and lead to an increased $R_{DS}$on (drain to source resistance in on-state). In addition, the profile of the n-sinker 108 is hard to control because of different thermal budget. The n-sinker 108 is used as a vertical connection between NBL 104 and drain contact 120. Since a high-energy implant step has its limitation in the implant depth, a larger thermal driver-in is required to push implant atoms deeper. In this kind of thermal, the n-sinker 108 receives a large thermal budget (temperature×hours) and results in an isotropic diffusion. Thus, the profile of n-sinker 108 becomes broader and deeper, which leads to a connection of NBL 104 with n-sinker 108 having an unwanted device area. Further, a multi-implant step is required for a deep n-sinker 108. Therefore, the body of the n-sinker 108 will become broader than expectation and the body of n-sinker 108 occupies an extra device area.

FIG. 2 illustrates a cross-section of another conventional vertical NMOS with a silicon-on-insulator (SOI) wafer. The NMOS has a p-substrate 102, a buried oxide (BOX) layer 202, n+ regions 204 connected to a drain contact 120, an n-epi layer 106, p-wells 210, source n+ regions 112 and p+ regions 114 both connected to the source contact 116, a gate 118, and isolation oxide layers 206 and 208. The oxide layers 206 and 208 provide pn-junction isolation and a higher break down voltage. The BOX layer 202 is also required for high voltage operation. Still, this structure requires a large lateral space 122 for isolation between the source 116 and the drain 120.

Accordingly, new methods and structures to reduce the required device area and to have a high breakdown voltage for high-side operations are needed.

SUMMARY

Embodiments herein describe a metal-oxide-semiconductor (MOS) device structure for high breakdown voltage (BV) and low turn-on resistance $R_{DS}$on in high voltage applications. Two general purposes are realized; one is to reduce device area and the other is to establish a high-side capable device. To reduce device area, drain current flows in a vertical direction and is collected by an n+ Buried Layer (NBL). A deep electrode (e.g. metal or polysilicon) surrounded by an insulator is connected to NBL for the drain current pickup. As a high dielectric strength insulator (e.g. oxide) is chosen, a smaller lateral space between source and drain can be achieved. The formation of the deep electrode, the insulator, and NBL, allows for a reduced device area and high-side operation.

In accordance with one embodiment, a semiconductor device includes a substrate, a buried n+ layer disposed in the substrate, an n-epi layer disposed over the buried n+ layer, p-well disposed in the n-epi layer, a source n+ region disposed in the p-well and connected to a source contact on one side, a first insulation layer disposed on top of the p-well and the n-epi layer, a gate disposed on top of the first insulation layer, and a metal electrode extending from the buried n+ layer to a drain contact, where the electrode is insulated from the n-epi layer and the p-well using a second insulation layer. The portion of the buried n+ layer contacting the metal electrode can be further n+ doped. The portion of the p-well adjacent to the source n+ region can be further p+ doped and connected to the source contact. The first insulation layer can be a high-voltage oxide layer. The second insulation layer can have a circular shape surrounding the metal electrode. The second insulation layer can be a dielectric layer, e.g. oxide. In another embodiment, a polysilicon electrode is used instead of the metal electrode.

In accordance with another embodiment, a method of fabricating a semiconductor device includes providing a semiconductor substrate, implanting a buried n+ layer on the substrate, forming an n-epi layer over the buried n+ layer, implanting a p-well in the n-epi layer, depositing a first insulation layer on top of the n-epi layer and the p-well where the first insulation layer covers only a specified area for a gate, forming the gate on top of the first insulation layer, implanting a source n+ region in the p-well, etching a trench in the n-epi layer and/or the p-well to expose the buried n+ layer and provide space for a drain electrode and an oxide insulation layer, depositing oxide in the trench, performing oxide Chemical-Mechanical Polishing (CMP), etching oxide in the trench to form a hole that extends to the buried n+ layer, implanting further an n+ region in the buried n+ layer exposed by the hole, and forming a drain electrode in the hole. The first insulation layer can be a high voltage oxide (HVOX) layer. The gate can be formed by performing polysilicon deposition and etching. In one embodiment, the drain electrode can be metal and formed by depositing and etching metal in the hole. In another embodiment, the drain electrode can be polysilicon and formed by depositing and etching polysilicon in the hole. The method can include implanting a p+ region adjoining the source n+ region in the p-well and providing a source contact connected to both the p+ region and the source n+ region.

Features of the disclosed embodiments include high operating voltage (e.g. in one embodiment, more than 700V was achieved), reduction of device area because of dielectric isolation (e.g. oxide), and a more robust breakdown voltage because of a stronger dielectric insulation (e.g. oxide) compared to silicon.

BRIEF DESCRIPTION OF THE DRAWINGS

Reference is now made to the following descriptions taken in conjunction with the accompanying drawings, in which.

DETAILED DESCRIPTION

The making and using of the presently preferred embodiments are discussed in detail below. It should be appreciated, however, that the disclosed embodiments provide many applicable inventive concepts that can be embodied in a wide variety of specific contexts. The embodiments discussed are merely illustrative of specific ways to make and use the semiconductor device, and do not limit the scope of the device.

A metal-oxide-semiconductor (MOS) device structure for high breakdown voltage (BV) and low turn-on resistance $R_{DS}$on in high voltage operations is provided. An embodiment of the structure and a method to fabricate the structure is provided, and the variations of the structure and method are also discussed. Throughout the various views and illustrative embodiments, like reference numbers are used to designate like elements.

Figure 1:
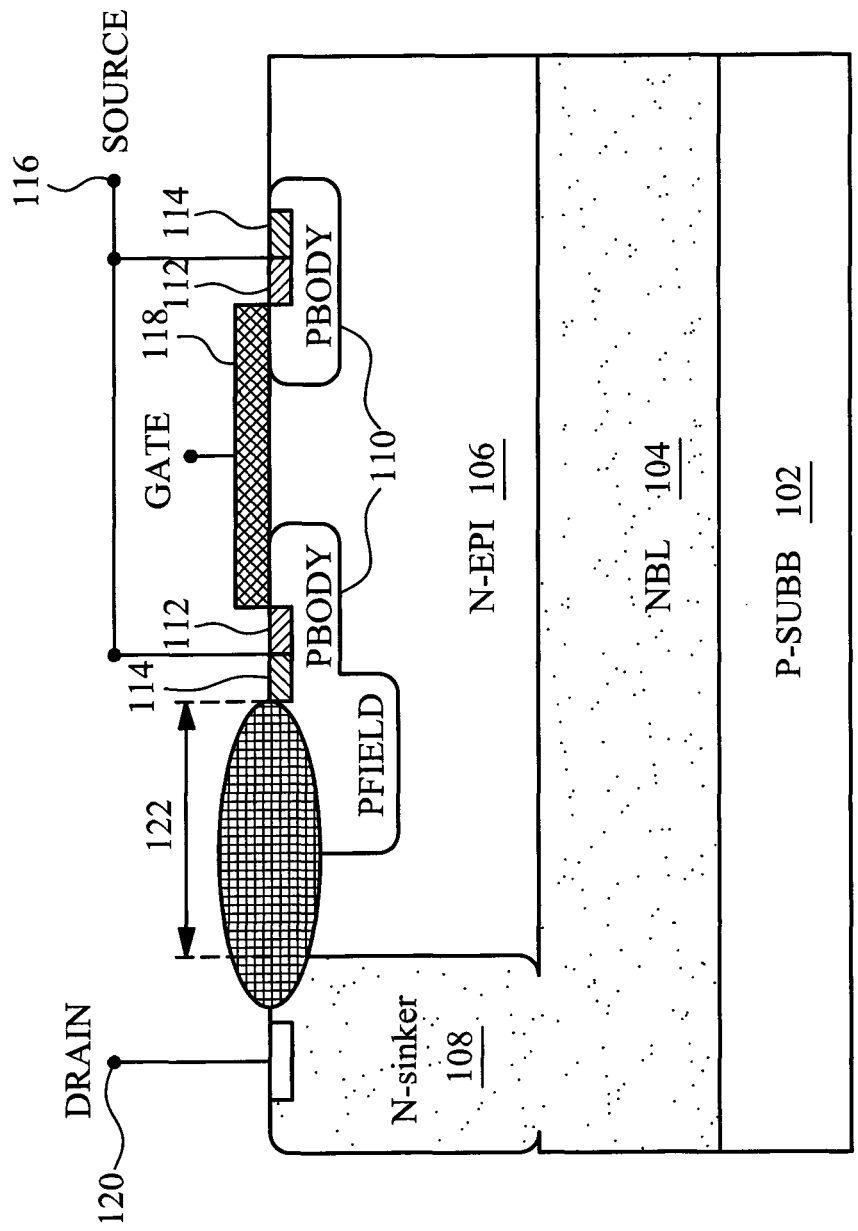
FIG. 1 illustrates a cross-section of a conventional vertical NMOS device with a p-substrate.
Figure 2:
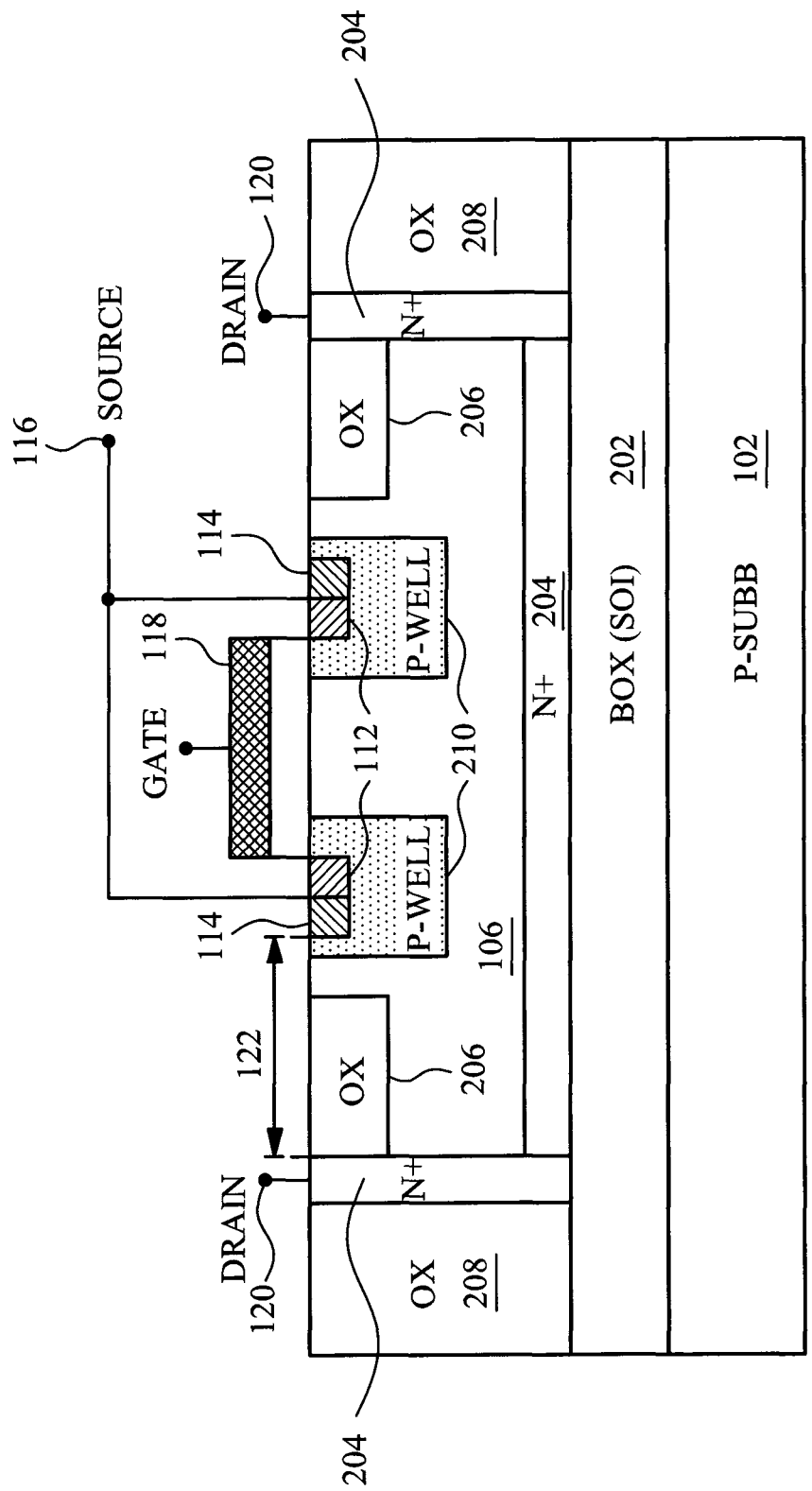
FIG. 2 illustrates a cross-section of another conventional vertical NMOS with a SOI wafer.
Figure 3:
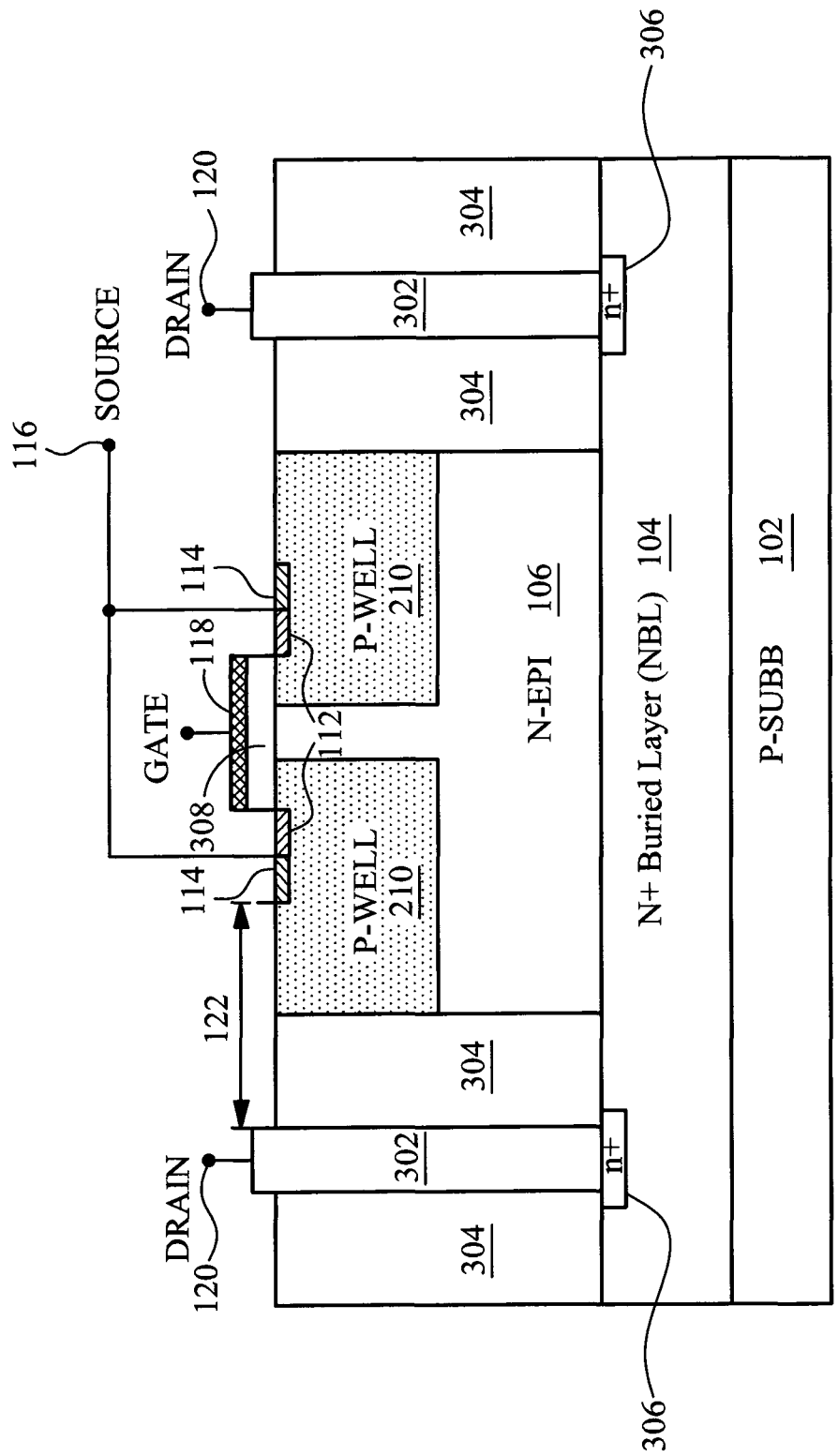
FIG. 3 illustrates a cross-section of an embodiment of a vertical NMOS having a deep electrode for vertical drain current collection.

FIG. 3 illustrates a cross-section of an example embodiment of a vertical NMOS device, and includes a deep electrode for vertical drain current collection. The vertical NMOS has a P-substrate 102, an n+ buried layer (NBL) 104, an n-epi layer 106, p-wells 210, source n+ regions 112 and p+ regions 114 both connected to the source contact 116, a gate 118, and a drain contact 120. Also, there are deep electrodes 302 connected to the drain contact 120 for a vertical drain current collection, n+ regions 306 under the deep electrodes 302 to reduce contact resistance, and insulation layers 304 surrounding the deep electrodes 302. The electrodes 302 can be implemented using metal or polysilicon, for example. The insulation layers 304 surrounding electrodes 302 can be dielectric material, e.g. oxide, and can be in a circular shape. The structure, including electrodes 302 and NBL 104 to collect vertical drain current, enable high-side operations.

In one embodiment, metal electrodes 302 and oxide insulation layer 304 enable high voltage operations of more than 700V. Also, because of a stronger oxide dielectric insulation layer 304 compared to silicon, a more robust breakdown voltage is possible. Further, the device area can be reduced because of the effective insulation using the insulation layer 304 surrounding electrodes 302, because the lateral space 122 needed for isolation between the source 116 and the drain 120 reduced.

Figure 4:
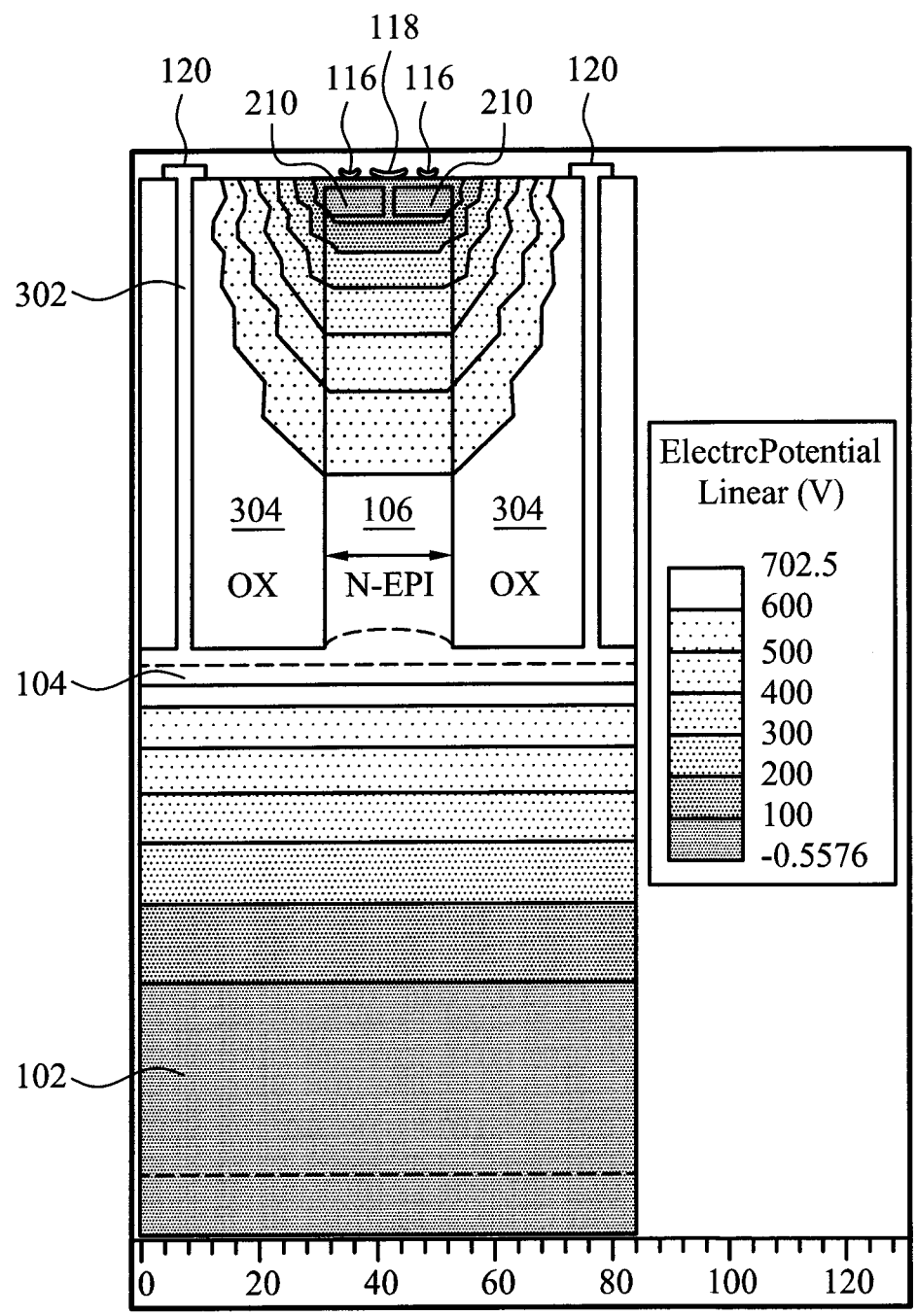
FIG. 4 illustrates one potential (voltage) distribution for the structure shown in FIG. 3.

FIG. 4 illustrates an example potential (voltage) distribution for the structure shown in FIG. 3, wherein electrodes 302 are metal and insulation layers 304 are oxide in FIG. 4. In FIG. 4, the p-substrate 102, the source contact 116, the gate 118, and the p-wells 210 show relative low voltage close to the surface (top or bottom), about less than 100V. The potential (voltage) increases as the location in the cross section diagram moves close to the electrodes 302, NBL 104, and the drain contact 120, to over 700V. The oxide insulation layer 304, n-epi layer 106, and p-substrate 102 show gradual variation of potential from less than 100V to over 700V, showing that the structure can sustain a high-side operation over 700V.

Figure 5:
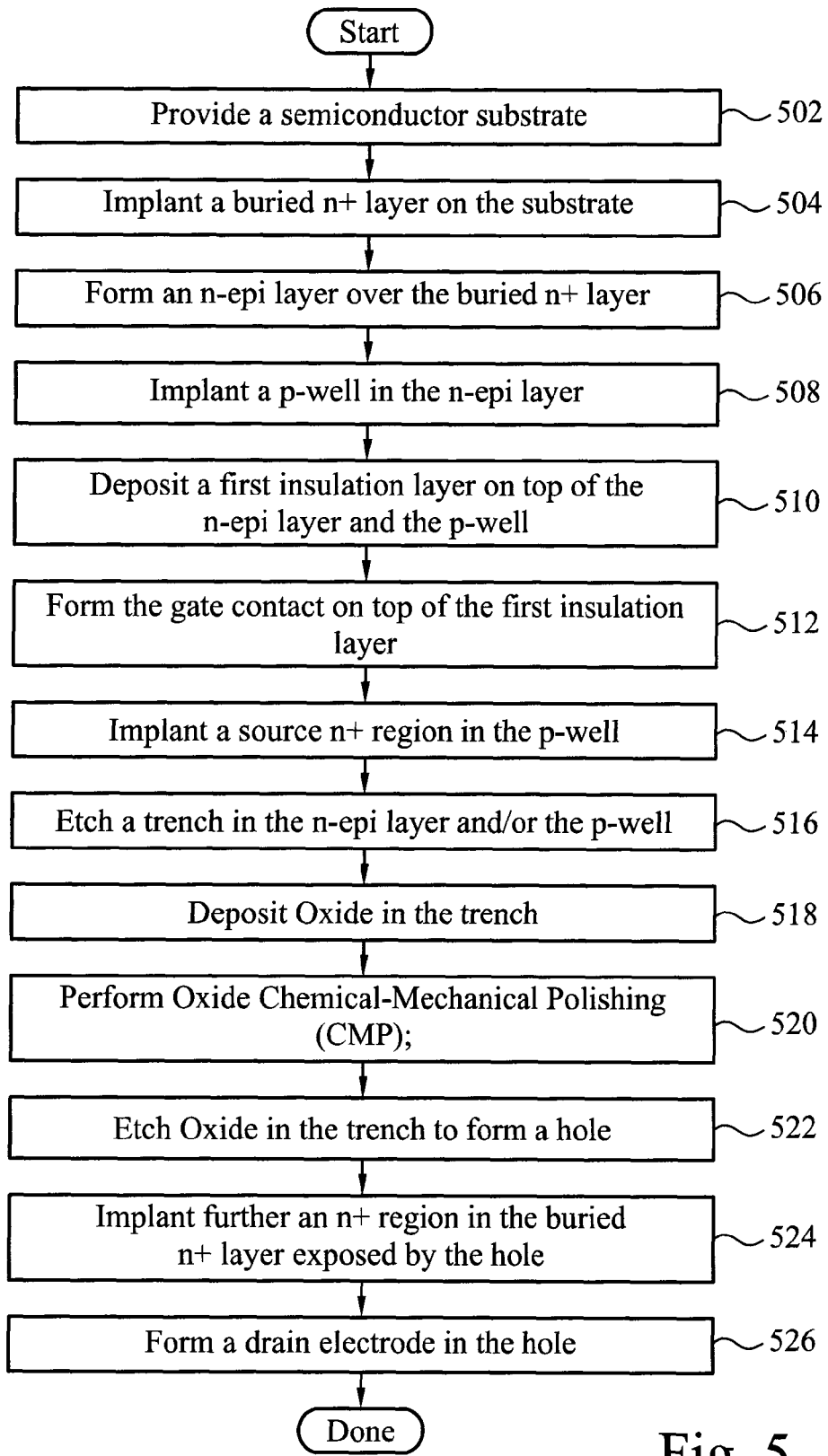
FIG. 5 illustrates a flow diagram showing an exemplary process to fabricate one embodiment of the device according to FIG. 3.

FIG. 5 illustrates a flow diagram showing an exemplary process to fabricate one embodiment of the NMOS device. At step 502, a semiconductor substrate (i.e. p-substrate 102) is provided for fabrication of the MOS device. At step 504, a buried n+ layer is implanted on the substrate to form the NBL 104. At step 506, an n-epi layer 106 is formed over the buried n+ layer 104. At step 508, a p-well 210 is implanted in the n-epi layer 106. At step 510, a first insulation layer 308 is deposited on top of the n-epi layer 106 and the p-well 210, where the first insulation layer 308 covers only a specified area for a gate 118. The first insulation layer 308 can be a high voltage oxide layer in one embodiment. At step 512, the gate 118 is formed on top of the first insulation layer 308. The gate 308 can be formed by performing polysilicon deposition and etching, for example. At step 514, a source n+ region 112 is implanted in the p-well 210. In one embodiment, a p+ region adjoining the source n+ region can be implanted to be connected to the source contact 116 together. At step 516, a trench is etched in the n-epi layer 106 and/or the p-well 210 to expose the buried n+ layer 104 and provide space for the drain electrode 302 and an oxide insulation layer 304 that surrounds the electrode 302. At step 518, oxide is deposited in the trench to form an insulation layer 304. At step 520, oxide Chemical-Mechanical Polishing (CMP) is performed. In another embodiment, it is possible to use "etch-back method" instead of CMP, especially for breakdown voltages smaller than 500V. At step 522, oxide in the trench is etched to form a hole that extends to the buried n+ layer to provide space for the electrode 302. At step 524, an n+ region 306 can be further implanted in the buried n+ layer exposed by the hole to improve the contact resistance of the electrode 302 to the buried n+ layer 104. At step 526, a drain electrode 302 is formed in the hole. The drain electrode 302 is one of metal and polysilicon, and it can be formed by depositing and etching metal or polysilicon.

Figure 6:
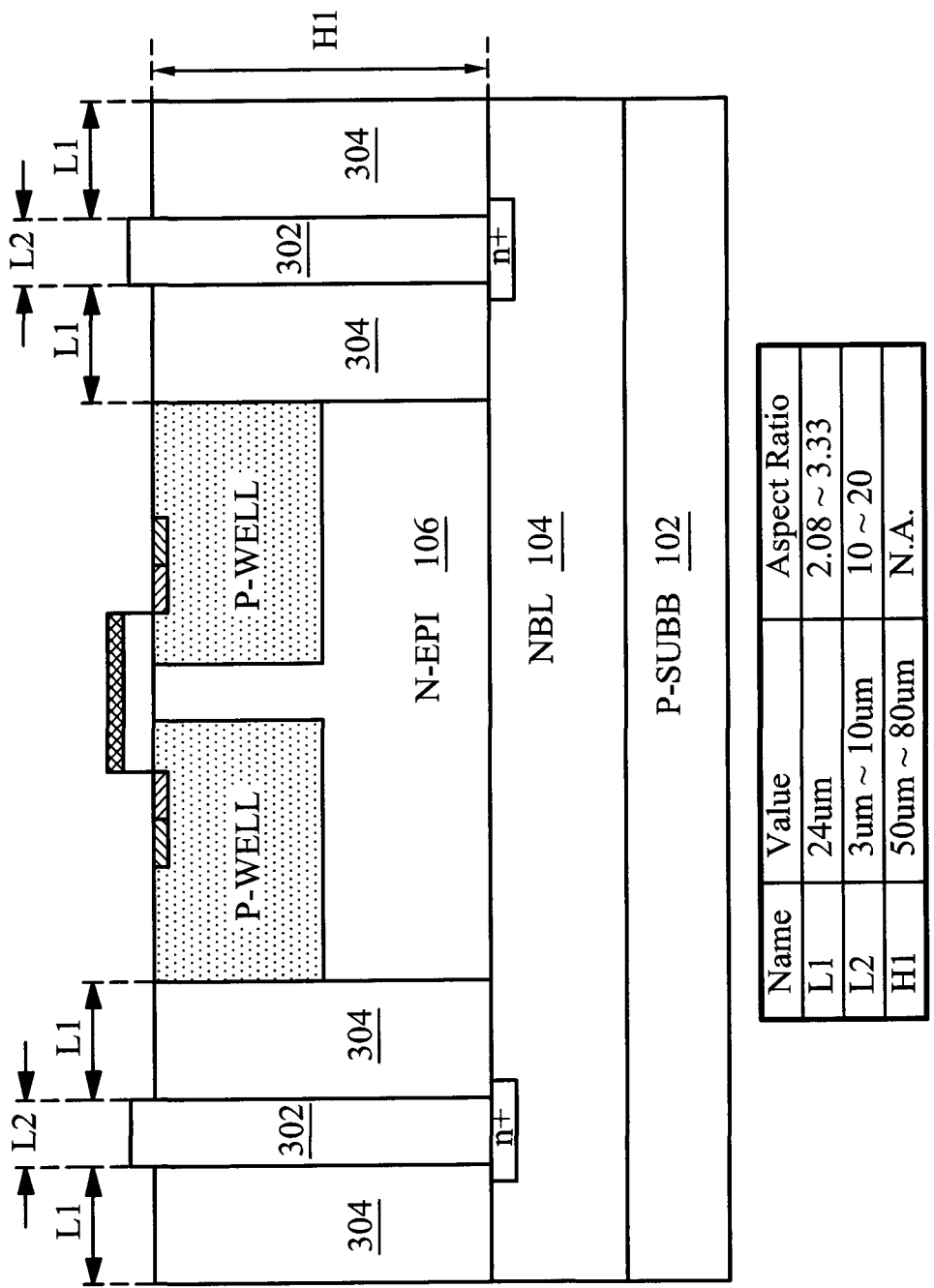
FIG. 6 illustrates an exemplary geometry of the device shown in FIG. 3.

FIG. 6 illustrates example geometry of the structure shown in FIG. 3. FIG. 6 shows a symmetric lateral length L1 of the insulation layer 304 around the electrode 302, the lateral length L2 of the electrode 302, and the height H1 of the insulation layer 304. The aspect ratio is the height (i.e. H1) over the lateral length (i.e. L1 or L2). In this example, for a value of L1=24 um, the aspect ratio is 2.08-3.33 for a value of H1=50 um~80 um. For the value of L2, 3 um-10 um is given in this example with an aspect ratio of 10~20. The aspect ratio can depend upon the etching capability in the process, e.g. the depth and precision that a deep trench can be etched for a small area.

Features of the disclosed embodiments include high operating voltage (e.g. in one embodiment, more than 700V was achieved), reduction of device area because of dielectric isolation (e.g. oxide), and a more robust breakdown voltage because of a stronger dielectric insulation (e.g. oxide) compared to silicon.

Although the embodiments and their features have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a substrate;
   a buried n+ layer disposed in the substrate;
   an n-epi layer disposed over the buried n+ layer;
   a p-well disposed in the n-epi layer;
   a source n+ region disposed in the p-well and connected to a source contact on one side;
   a first insulation layer disposed on top of the p-well and the n-epi layer;
   a gate disposed on top of the first insulation layer; and
   a metal electrode extending from the buried n+ layer to a drain contact, wherein the metal electrode is insulated from the n-epi layer and the p-well by a second insulation layer.

2. The semiconductor device of claim 1, wherein a portion of the buried n+ layer contacting the metal electrode is n+ doped.

3. The semiconductor device of claim 1, wherein a portion of the p-well adjacent to the source n+ region is p+ doped and connected to the source contact.

4. The semiconductor device of claim 1, wherein the first insulation layer is a high-voltage oxide layer.

5. The semiconductor device of claim 1, wherein the second insulation layer has a circular shape surrounding the metal electrode.

6. The semiconductor device of claim 1, wherein the second insulation layer is an oxide layer.

7. A method of fabricating a semiconductor device comprising:
   providing a semiconductor substrate;
   implanting a buried n+ layer on the substrate;
   forming an n-epi layer over the buried n+ layer;
   implanting a p-well in the n-epi layer;
   depositing a first insulation layer on top of the n-epi layer and the p-well, wherein the first insulation layer covers only a specified area for a gate;
   forming the gate on top of the first insulation layer;
   implanting a source n+ region in the p-well;
   etching a trench in the n-epi layer and/or the p-well to expose the buried n+ layer and provide space for a drain electrode and an oxide insulation layer;
   depositing oxide in the trench;
   performing oxide Chemical-Mechanical Polishing (CMP);
   etching oxide in the trench to form a hole that extends to the buried n+ layer;
   implanting further an n+ region in the buried n+ layer exposed by the hole; and
   forming a drain electrode in the hole.

8. The method of claim 7, wherein the first insulation layer is a high voltage oxide (HVOX) layer.

9. The method of claim 7, wherein the gate is formed by performing polysilicon deposition and etching.

10. The method of claim 7, wherein the drain electrode is metal.

11. The method of claim 10, wherein the drain electrode is formed by depositing and etching metal in the hole.

12. The method of claim 7, wherein the drain electrode is polysilicon.

13. The method of claim 12, wherein the drain electrode is formed by depositing and etching polysilicon in the hole.

14. The method of claim 7, further comprising:
   implanting a p+ region adjoining the source n+ region in the p-well; and
   forming a source contact connected to both the p+ region and the source n+ region.

* * * * *